(12) United States Patent
Benaben et al.

(10) Patent No.: US 12,502,722 B2
(45) Date of Patent: Dec. 23, 2025

(54) METHOD FOR HEATING A SOLDERED JOINT

(71) Applicants: Continental Automotive France, Toulouse (FR); Continental Automotive GmbH, Hannover (DE)

(72) Inventors: Cédric Benaben, Toulouse (FR); Stéphane Vitali, Toulouse (FR)

(73) Assignee: SCHAEFFLER TECHNOLOGIES AG & CO. KG, Herzogenaurach (DE)

( * ) Notice: Subject to any disclaimer, the term of this patent is extended or adjusted under 35 U.S.C. 154(b) by 0 days.

(21) Appl. No.: 17/864,760

(22) Filed: Jul. 14, 2022

(65) Prior Publication Data

US 2022/0347779 A1 Nov. 3, 2022

Related U.S. Application Data

(62) Division of application No. 16/489,749, filed as application No. PCT/FR2018/051236 on May 25, 2018.

(30) Foreign Application Priority Data

May 30, 2017 (FR) ...................... 1754757

(51) Int. Cl.
*B23K 1/018* (2006.01)
*B23K 3/047* (2006.01)
(Continued)

(52) U.S. Cl.
CPC .............. *B23K 1/018* (2013.01); *B23K 3/047* (2013.01); *H01L 24/98* (2013.01); *H05K 13/0486* (2013.01); *B23K 2101/42* (2018.08)

(58) Field of Classification Search
CPC ...... B23K 1/018; B23K 2101/42; B23K 3/03; B23K 3/047; F02D 2041/2027
See application file for complete search history.

(56) References Cited

U.S. PATENT DOCUMENTS

| 3,526,750 A | 9/1970 | Siegel |
| 3,557,430 A * | 1/1971 | Jones ..................... B23K 1/018 228/19 |

(Continued)

FOREIGN PATENT DOCUMENTS

| CN | 201205630 Y | 3/2009 |
| CN | 101439432 A | 5/2009 |

(Continued)

OTHER PUBLICATIONS

Non Final Office Action for U.S. Appl. No. 16/489,749, dated Aug. 31, 2022, 17 pages.
(Continued)

*Primary Examiner* — Minh N Trinh
(74) *Attorney, Agent, or Firm* — Buchanan Ingersoll & Rooney PC

(57) ABSTRACT

A method for a heating device suitable for heating at least one soldered joint between an electronic component including at least a first contact mound and a printed circuit board. The soldered joint on the one hand securing the electronic component to the printed circuit board and on the other hand, while providing electrical continuity, the electronic component also having an electronic-component width, and an electronic-component thickness, wherein it includes an electrical-connection suitable for being coupled to an electrical power supply and a heater suitable for reaching a temperature at least equal to the melting point of the solder.

5 Claims, 7 Drawing Sheets

(51) Int. Cl.
    *B23K 101/42*         (2006.01)
    *H01L 23/00*          (2006.01)
    *H05K 13/04*         (2006.01)

(56) References Cited

U.S. PATENT DOCUMENTS

| | | | |
|---|---|---|---|
| 3,786,228 | A | 1/1974 | Castellana et al. |
| 3,813,023 | A | 5/1974 | Auray et al. |
| 4,159,074 | A * | 6/1979 | Basseches ............ B23K 1/018 |
| | | | 228/264 |
| 4,187,972 | A | 2/1980 | Vella |
| 4,637,542 | A * | 1/1987 | Breske ............ B23K 3/047 |
| | | | 228/264 |
| 4,659,004 | A * | 4/1987 | Fridman ............ H05K 13/0486 |
| | | | 228/49.1 |
| 4,918,277 | A | 4/1990 | Zimmer |
| 5,058,796 | A | 10/1991 | Schwarzbauer |
| 5,241,156 | A | 8/1993 | Wallgren et al. |
| 5,565,119 | A | 10/1996 | Behun et al. |
| 5,650,081 | A | 7/1997 | Hudson |
| 5,909,838 | A | 6/1999 | Jimarez et al. |
| 6,062,460 | A | 5/2000 | Sato |
| 6,629,631 | B2 | 10/2003 | Murtishaw |
| 6,732,907 | B2 * | 5/2004 | Miyazawa ............ B23K 1/085 |
| | | | 228/180.1 |
| 7,469,457 | B2 * | 12/2008 | Ishikawa ............ H05K 13/0491 |
| | | | 257/E21.511 |
| 2002/0162880 | A1 | 11/2002 | Jackson et al. |
| 2003/0019918 | A1 | 1/2003 | Farooq et al. |
| 2022/0347779 | A1 * | 11/2022 | Benaben ............ B23K 3/03 |

FOREIGN PATENT DOCUMENTS

| | | | | |
|---|---|---|---|---|
| DE | 9405654 | U1 | 6/1994 | |
| EP | 0851722 | A1 | 7/1998 | |
| FR | 2407045 | A1 | 5/1979 | |
| FR | 2421029 | A1 | 10/1979 | |
| JP | 582548 | A | 1/1983 | |
| JP | 6074843 | A | 4/1985 | |
| JP | 61162361 | A | 7/1986 | |
| JP | 62122378 | A | 6/1987 | |
| JP | 6319967 | A | 1/1988 | |
| JP | 2008193083 | A * | 8/2008 | .......... H01L 23/345 |
| JP | 2015166096 | A | 9/2015 | |

OTHER PUBLICATIONS

International Search Report and Written Opinion for International Application No. PCT/FR2018/051236, dated Sep. 21, 2018, 9 pages.
Chinese Office Action for Chinese Application No. 201880035832.3, issued Jan. 28, 2021, with translation, 19 pages.
Final Office Action for U.S. Appl. No. 16/489,749, mailed Nov. 25, 2022, 6 pages.
Non Final Office Action for U.S. Appl. No. 16/489,749 mailed Mar. 30, 2023, 10 pages.
Final Office Action for U.S. Appl. No. 16/489,749 mailed Aug. 15, 2023, 8 pages.
Final Office Action for U.S. Appl. No. 16/489,749 mailed Jan. 17, 2024, 13 pages.
Non Final Office Action for U.S. Appl. No. 16/489.749 mailed Nov. 8, 2023, 13 pages.

* cited by examiner

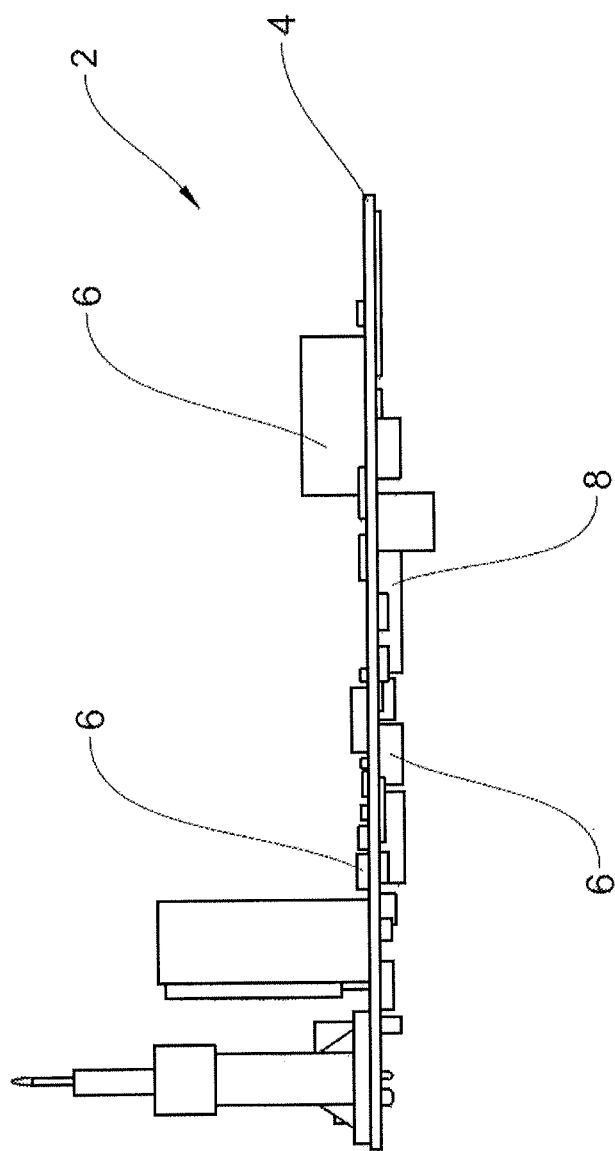

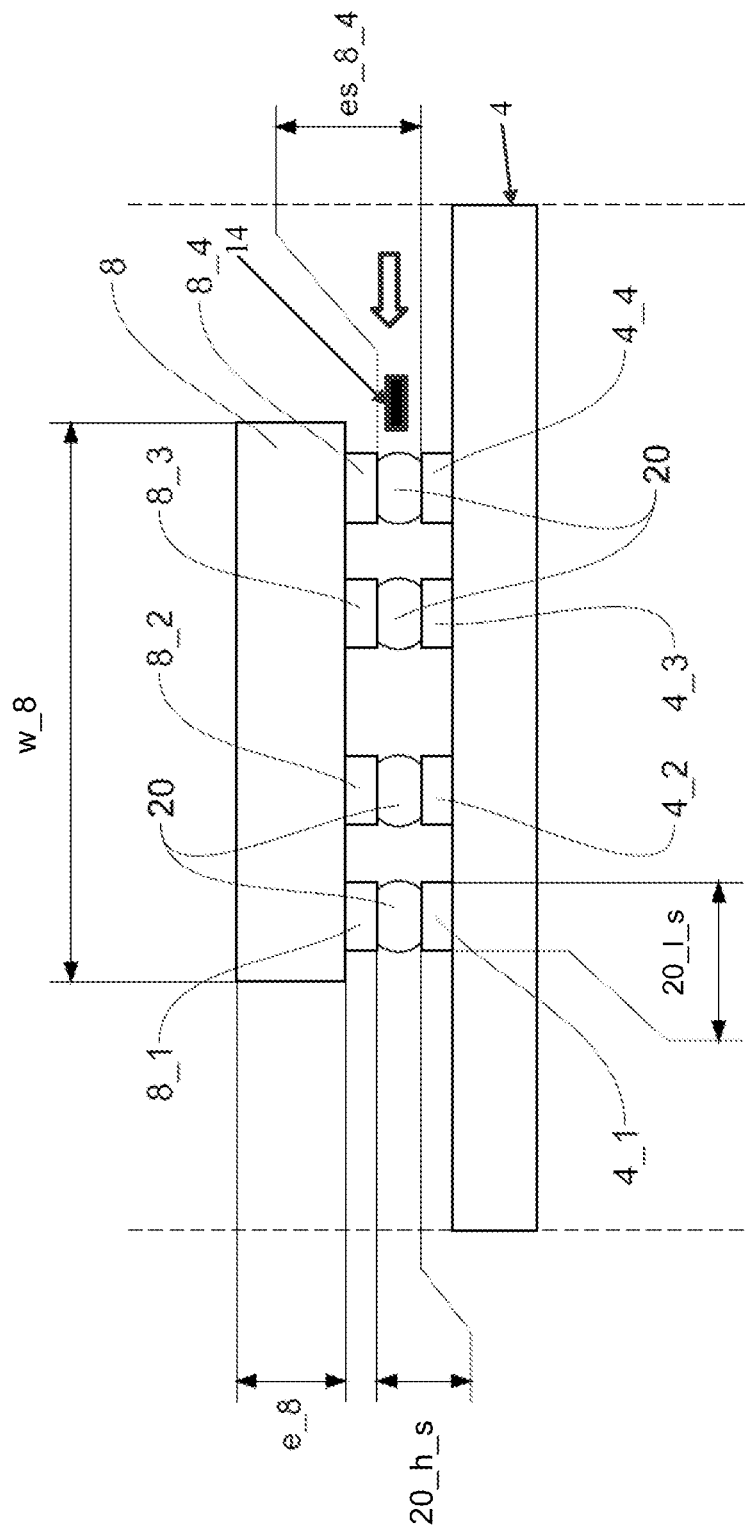

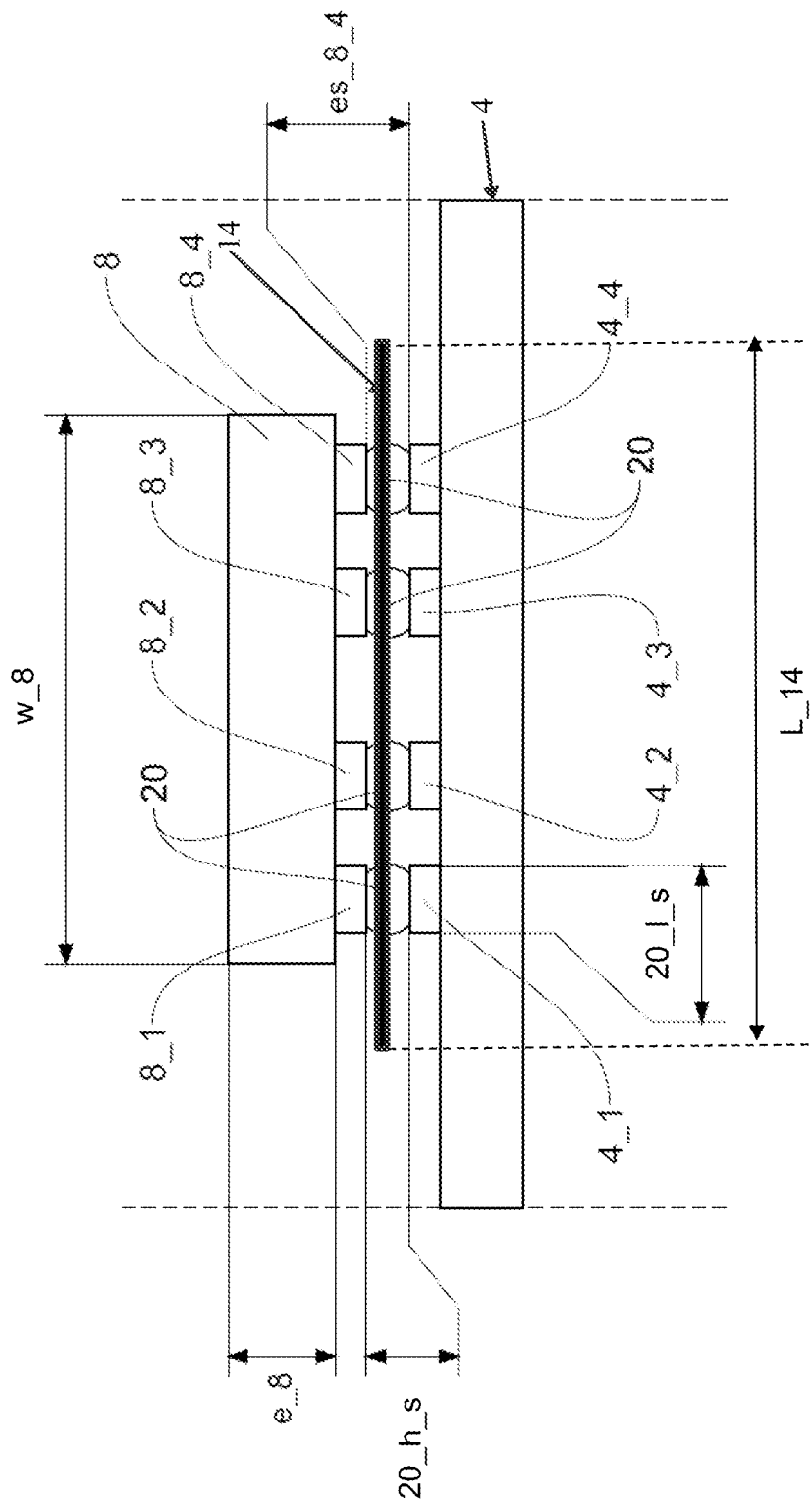

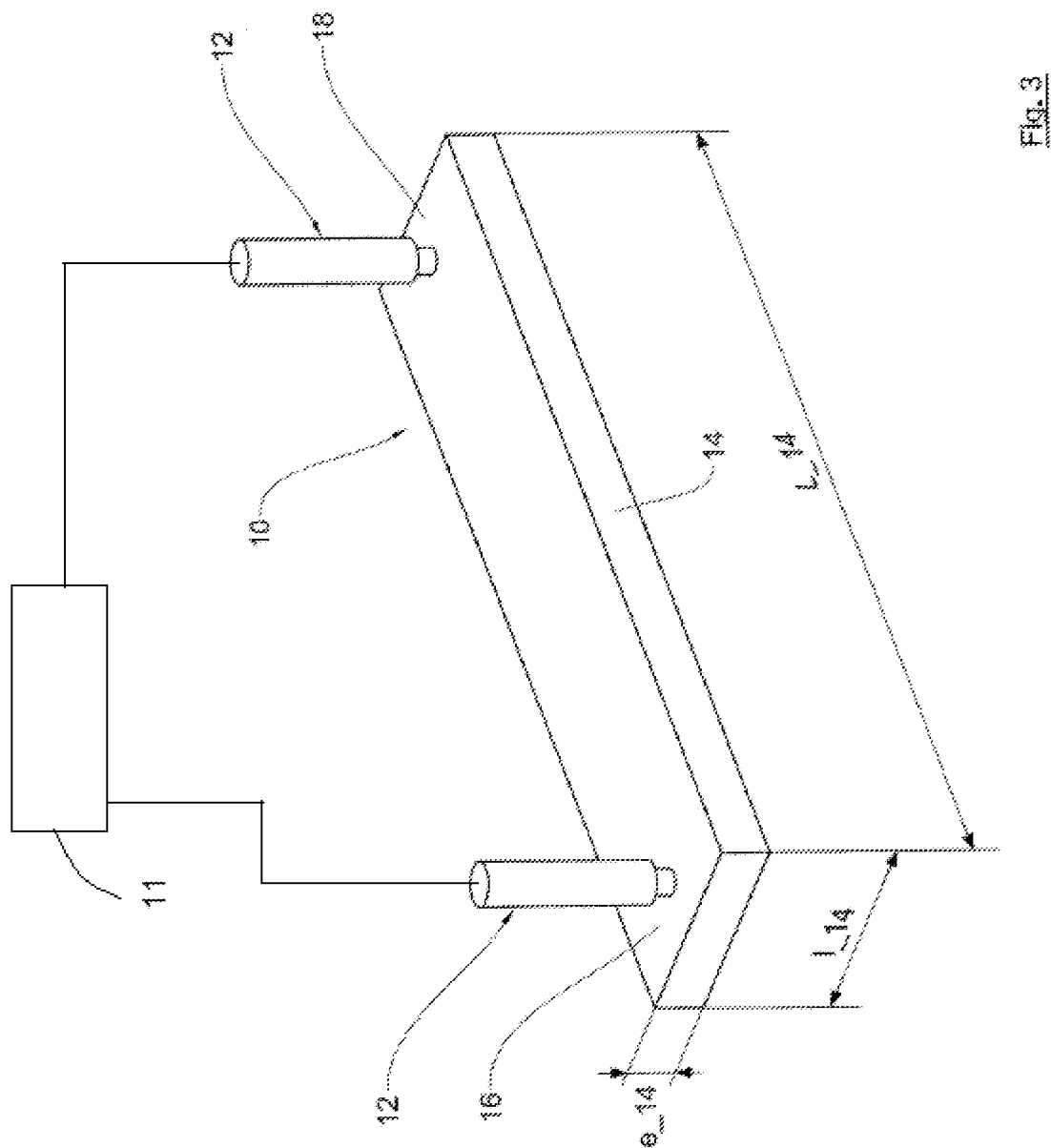

METHOD FOR HEATING A SOLDERED JOINT

CROSS REFERENCE TO RELATED APPLICATIONS

This application is the divisional application of U.S. application Ser. No. 16/489,749, filed Aug. 29, 2019, which is the U.S. National Phase Application of PCT International Application No. PCT/FR2018/051236, filed May 25, 2018, which claims priority to French Patent Application No. 1754757, filed May 30, 2017, the contents of such applications being incorporated by reference herein.

FIELD OF THE INVENTION

The present invention relates in general to a heating device for desoldering an electronic component from a printed circuit board.

The invention is applicable in particular in the field of electronics.

BACKGROUND OF THE INVENTION

An electronic device such as an electronic engine control computer arranged in a motor vehicle experiences numerous stresses. These stresses may be of a mechanical, thermal, electrical nature and may sometimes cause permanent or intermittent failures of said electronic engine control computer.

These engine control computer failures or faults require the intervention of a skilled individual to diagnose them. In order to perform this analysis of the failure of said electronic engine control computer, it is often necessary to remove same from said motor vehicle so that the origin of the fault can be inspected.

The high density at which electronic components are integrated mean that certain complex electronic components, such as a microcontroller for example, need to be removed in order to analyze the origin of the fault. In order to do this, it is known practice to locally heat the electronic component that is to be desoldered, as well as the printed-circuit board, using a bell so as to melt the metal alloy of the soldered joint(s). Before performing this step, it is necessary to place the electronic board that is to be tested in an oven, something which can sometimes make an observed fault associated, for example with an ingress of moisture into the printed-circuit board and/or into the electronic component, disappear.

SUMMARY OF THE INVENTION

An aspect of the invention proposes a heating device that provides a partial or full solution to the technical shortcomings of the cited prior art.

To this end, a first aspect of the invention proposes a heating device suitable for heating at least one soldered joint between an electronic component comprising at least a first contact mound and a printed circuit board, the soldered joint on the one hand securing the electronic component to the printed circuit board and on the other hand providing electrical continuity, the electronic component also having an electronic-component width, and an electronic-component thickness, characterized in that it comprises electrical-connection means suitable for being coupled to an electrical power supply and heating means suitable for reaching a temperature at least equal to the melting point of the material of which the solder is made.

For example, the heating means have a cylindrical shape.

As an alternative, the heating means have a parallelepipedal shape.

In order to improve the effectiveness of the heating device, it is proposed for example that the heating means have a heating-means thickness smaller than a space separating the electronic component from the printed circuit board.

In order to make the heating device easier to manipulate, the heating means have for example a heating-means length that is greater than the width of the electronic component.

In order to desolder the electronic component from the printed circuit it is for example proposed that the heating means be suitable for reaching a temperature at least equal to the melting point of the material of which the solder is made.

A second aspect of the invention proposes a method for heating at least one soldered joint between an electronic component and a printed circuit board, comprising the following steps:

coupling the heating device to an electrical power supply, placing the heating device between the electronic component and the printed circuit board at a space separating said electronic component from the printed circuit board, activating the electrical power supply, and moving the heating means under the electronic component against the solder at a determined speed when the temperature of the heating means reaches a melting point of the solder.

BRIEF DESCRIPTION OF THE DRAWINGS

Other features and advantages of aspect of the invention will become more apparent upon reading the description that will follow. This description is purely illustrative and should be read with reference to the appended drawings, in which:

FIG. 1 is a simplified diagram of an electronic board,

Fig. 2A is a view in cross section of the electronic board of FIG. 1,

FIG. 2B is another view in cross section of the electronic board of FIG. 1, FIG. 3 is a schematic diagram of the device of an aspect of the invention.

DETAILED DESCRIPTION OF THE PREFERRED EMBODIMENTS

Figure 4:
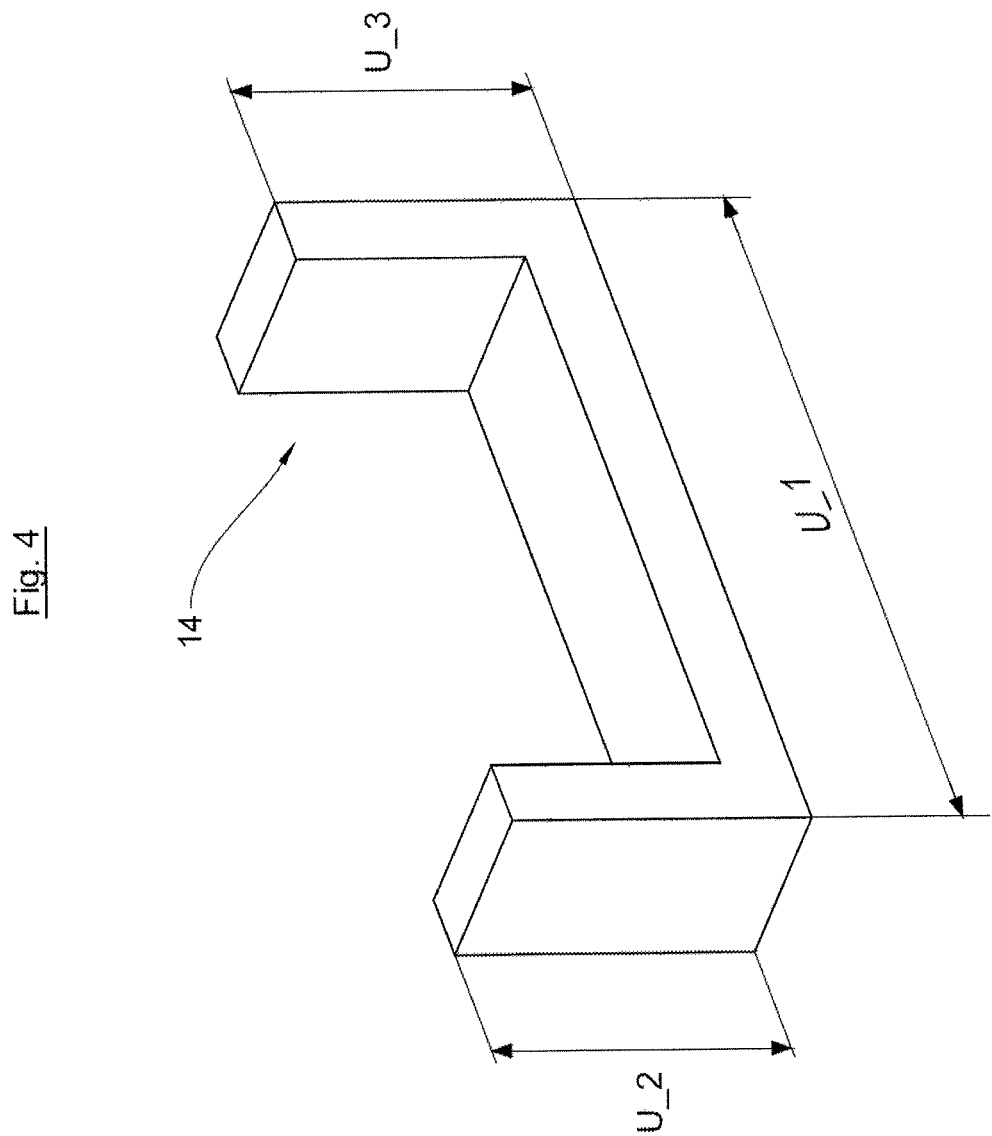
FIG. 4 is a schematic diagram of the device of an aspect of the invention according to another embodiment.
Figure 5:
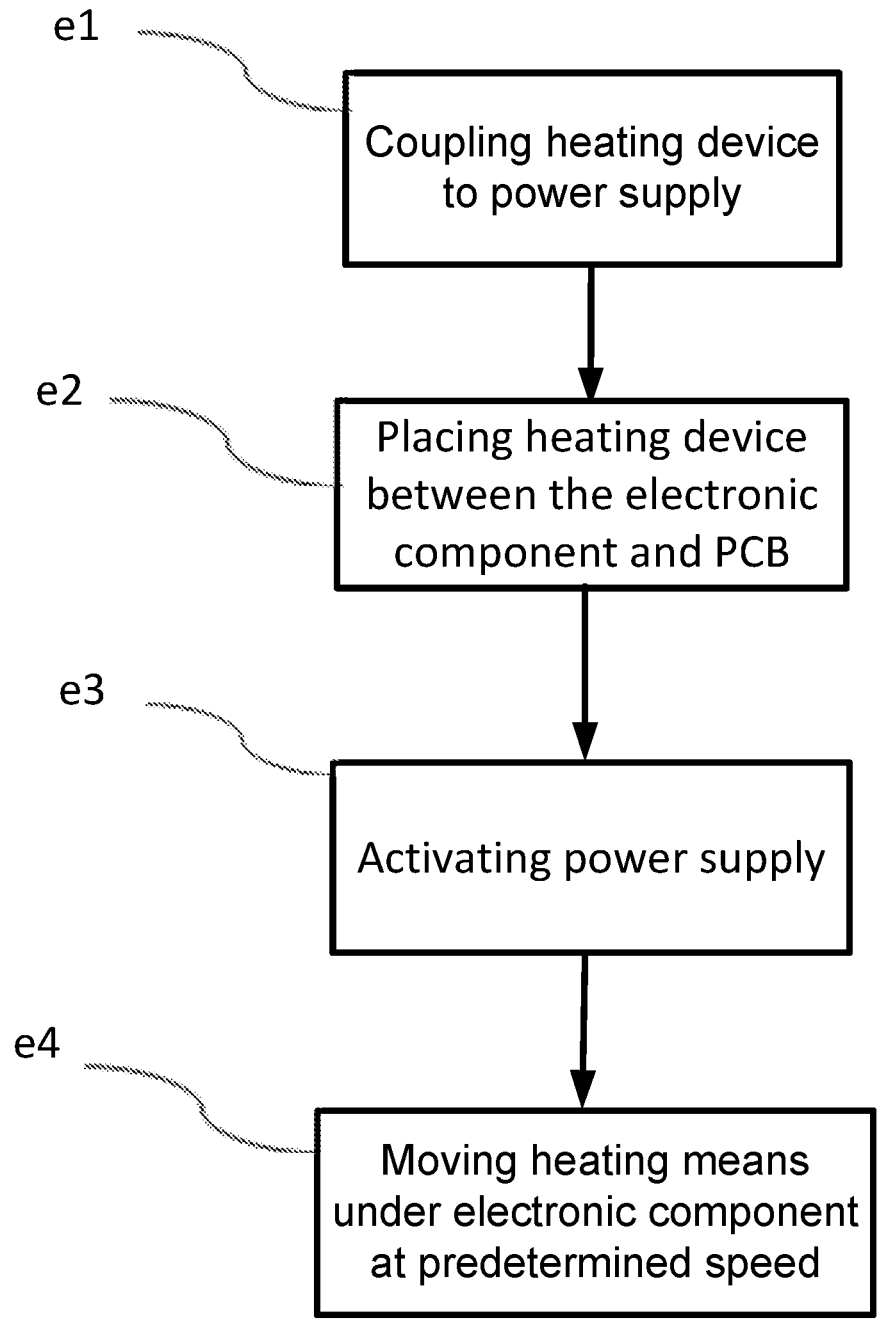
FIG. 5 is a flowchart depicting an overall method for heating a soldered joint between an electronic component and a printed circuit board.

FIG. 1 depicts a schematic view of an electronic board 2 which may be that of an electronic engine control computer arranged in a motor vehicle. The electronic board 2 comprises a printed circuit board 4, also referred to as a PCB, on which electronic components 6 are arranged. The printed circuit board 4 may be a single-layer or multi-layer printed circuit board depending on the complexity of the electronic board 2. The electronic components 6 may be of various forms and have a variable number of pins.

In the example which follows and to illustrate an aspect of the invention, a complex electronic component 8 is also soldered to the printed circuit board 4. The complex electronic component 8 is, for example, a microcontroller. For preference, the complex electronic component 8 is provided with a Ball Grid Array, or BGA package. Furthermore, one of the advantages of such a component equipped with a BGA package is its compactness which allows it to have a relatively high density of contact mounds, corresponding to a distance between the balls of solder. For example, the distance between the balls of solder is of the order of 100 μm (1 μm=1.10⁻6 m).

Fig. 2A schematically depicts a view in cross section of the complex electronic component 8 soldered to the printed circuit board 4. The complex electronic component 8 therefore has a ball grid made up in this example of a first contact mound 8_1, of a second contact mound 8_2, of a third contact mound 8_3 and of a fourth contact mound 8_4. The number of contact mounds and the layout of the contact mounds are given by way of example. Furthermore, the complex electronic component 8 has a complex electronic component thickness e_8 and a complex electronic component-width I_8 width w_8. FIG. 2A schematically depicts the heating means 14 underneath the complex electrical component 8 and an arrow showing the direction of movement of the heating means 14 toward the complex electrical component 8.

The printed circuit board 4 comprises a first socket 4_1, a second socket 4_2, a third socket 4_3 and finally a fourth socket 4_4. In one exemplary embodiment, the sockets 4_1 to 4_4 have the same shape as that of the contact mounds 8_1 to 8_4. Furthermore, the sockets 4_1 to 4_4 on the one hand have the same spacing as the spacing of the contact mounds 8_1 to 8_4, and on the other hand have the same layout as that of the contact mounds 8_1 to 8_4.

In order to achieve contact and electrical continuity between the complex electronic component 8 and the printed circuit board 4, soldered joints 20 are made using a metal alloy. Soldering of the "wave" type well known to those skilled in the art is performed for example.

As mentioned earlier in the text of the description, it is sometimes possible for faults to occur in an electronic component 6 of the electronic engine control computer. In our case for example, it will be the complex electronic component 8 which will exhibit a fault. This fault may, for example, be 20 a fault on an analog input that will entail unmounting the complex electronic component 8.

In the example of Fig. 2A and the subsequent figures, in order to illustrate an aspect of the invention and the associated method, it has been chosen that the second socket 4_2 of the printed circuit board 4 is defective. In order to identify this fault and locate it, it is necessary to desolder the complex electronic component 8 from the printed circuit board 4 in order to determine whether the fault stems from the printed circuit board 4 or from the complex electronic circuit 8.

FIG. 2B schematically depicts a view in cross section of the complex electronic component 8 soldered to the printed circuit board 4, and the heating means 14 underneath the entire width w_8 of the complex electrical component 8, which advantageously allows the complex electrical component 8 to be desoldered from the printed circuit board 4.

In order to do that, an aspect of the present invention proposes a heating device 10 suitable for heating the soldered joints and desoldering the complex electronic component 8 from said printed circuit board 4 without heating said printed circuit board 4 and without the use of a bell.

As illustrated in FIG. 3, the heating device 10 comprises electrical-connection means 12 and heating means 14. The heating means 14 adopt, for example, a parallelepipedal shape like a blade. The heating means 14 have a heating-means length L_14, a heating-means width I_14 and a heating-means thickness e_14.

Advantageously, to make it easier for the heating means 14 to pass under the complex electronic component 8, it is proposed that the heating-means length L_14 have a value that is slightly greater than the value of the width w_8 of the complex electronic component. Thus, for example, the heating-means length L_14 is equal to 1.5 cm, for a complex electronic component width w_8 equal to 1.3 cm.

Furthermore, in order to allow heating means 14 to pass underneath and between the complex electronic component 8 and the printed circuit board 4, the heating-means thickness e_14 is less than a space es_8_4 separating the complex electronic component 8 from the printed circuit board 4. This space es_8_4 is equal and imposed by a height of solder 20_h_s. For example, in instances in which the value of the height of solder 20_h_s is equal to 100 μm, the heating-means thickness e_14 adopts a value of 80 μm.

Also, in order to improve the effectiveness of the heating device 10, it is proposed that the heating means 14 and, more particularly, the heating-means width I_14 have a value greater than a solder width 20_I_s.

The heating device 10 also has a heating-means first end 16 and a heating-means second end 18. The heating-means first end 16 and the heating-means second end 18 are arranged one on each side of the heating means 14. In the exemplary embodiment illustrated here, they are arranged one on each side of the blade.

These two ends 16 and 18 are suited to receiving and/or being coupled to the electrical- connection means 12. The electrical-connection means 12 are, for example, two electric wires coupled to a stabilized electrical power supply 11.

In another exemplary embodiment of an aspect of the invention and as illustrated in FIG. 4, the heating means 14 are U-shaped. For example, a first part of the U, referred to as U_1, has a length at least equal to the width w_8 of the complex electrical component 8. Furthermore, the two arms of the U, referred to as U_2 and U_3 have a same dimension at least equal to, but preferably greater than, the complex electronic component thickness e_8. In another exemplary embodiment, the two arms of the U, referred to as U_2 and U_3 have a height at least equal to the sum of the complex electronic component thickness e_8 and the height of solder 20_h_s.

Figure 6:
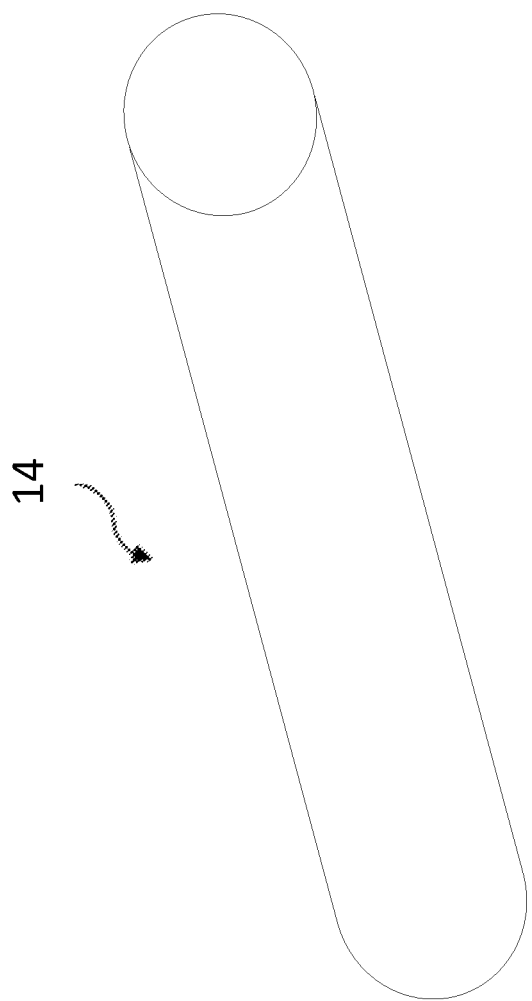
FIG. 6 is a schematic diagram of the device of an aspect of the invention according to another embodiment.

In another exemplary embodiment illustrated in FIG. 6, the heating means 14 have a cylindrical shape in which a diameter of the cylinder is less than the height of solder h_s.

The heating device 10 is, for example, made of metal or of metal alloy.

An aspect of the invention also proposes a heating method making it possible to heat at least one soldered joint of a ball grid array of an electronic component 6 and more particularly of a complex electronic component 8. In the remainder of the description, it will be considered that the electronic board 2 is outside the housing of the electronic engine control computer. Furthermore, it will be considered that a possible fault has been observed and located to an area in which the complex electronic component 8 is present.

The method of an aspect of the invention proposes first of all in a first step e1 coupling the electrical connection means 12 to an electrical power supply 11. In one exemplary embodiment, the electrical power supply 11 is a stabilized supply.

During a second step e2, the heating device 10 is brought closer to the complex electronic component 8 that is to be desoldered. For preference, the heating means 14 are positioned at the space es_8_4 separating the complex electronic component 8 from the printed circuit board 4. Furthermore, the heating means 14 are positioned against the soldered joint(s) 20.

During a third step e3, the electrical power supply 11 is activated. This power supply 11 is suitable for generating sufficient voltage that the heating means 14 reach a temperature at least equal to a melting point of the metal alloy of which the soldered joints are made. In one exemplary embodiment, the temperature is 250° C.

During a fourth step e4,the heating device 10 is moved around so that it passes between the complex electronic component 8 and the printed circuit board 4. Advantageously, the speed at which the heating device 10 moves is connected to the rate at which the metal alloy of the soldered joints 20 melts on contact with the heating means 14. In one exemplary embodiment, the heating device is moved across the entire width of the complex electronic component 8, something which advantageously allows it to be desoldered from the printed circuit board 4.

An aspect of the present invention thus allows the soldered joint(s) attaching an electronic component to a printed circuit board to be heated without the use of a bell. Thus, advantageously, only the electronic component that is to be desoldered experiences a rise in temperature, thereby improving the reliability with which a fault is detected. Thus it is possible to desolder and remove the electronic component from the printed circuit board without excessively heating the nearby components.

Of course, aspects of the present invention are not limited to the preferred embodiment described above and illustrated in the drawing and to the variant embodiments mentioned, but extends to all variants within the competence of those skilled in the art.

What is claimed:

1. A method for heating, with a heating device, at least one soldered joint between an electronic component or a complex electronic component pre-attached on a printed circuit board with a space separating the electronic component from the printed circuit board, the method comprising:
   providing the heating device includes electrical-connection means attached to heating means, said heating means suitable for reaching a temperature at least equal to a melting point of a solder of the at least one solder joint;
   coupling the electrical-connection means to an electrical power supply to activate the heating means;
   placing the heating device in an area adjacent to the solder of the at least one soldered joint between the pre-attached electronic component and the printed circuit board at the space separating said pre-attached electronic component from the printed circuit board;
   activating the electrical power supply to pre-heat the heating means until the temperature reaches the temperature at least equal to the melting point of the solder of the at least one solder joint;
   moving the heating means under the pre-attached electronic component against the at least one solder joint at a predetermined speed to melt the solder of the at least one solder joint, wherein the predetermined speed is related to a rate at which the temperature of the heating means reaches the melting point of the solder of the at least one solder joint; and
   melting the solder of the at least one solder joint while moving the heating means between the pre-attached electronic component and the printed circuit board until the pre-attached electronic component is fully desoldered and separated from the printed circuit board.

2. The method as claimed in claim 1, wherein in the providing the heating device, the heating means has a cylindrical shape or a parallelepipedal shape.

3. The method as claimed in claim 1, wherein in the providing the heating device, the heating means has a thickness smaller than a height of the solder of the at least one solder joint between the electronic component or the complex electronic component pre-attached on the printed circuit board.

4. The method as claimed in claim 1, wherein a width of the pre-attached electronic component is less than a length of the heating means.

5. The method as claimed in claim 1, wherein the melting the solder further comprises removing the pre-attached electronic component from the printed circuit board.

\* \* \* \* \*